United States Patent
Ivanov et al.

(10) Patent No.: US 7,466,201 B1
(45) Date of Patent: Dec. 16, 2008

(54) CLASS AB OUTPUT STAGE AND METHOD FOR PROVIDING WIDE SUPPLY VOLTAGE RANGE

(75) Inventors: Vadim V. Ivanov, Tucson, AZ (US); Ralph G. Oberhuber, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 32 days.

(21) Appl. No.: 11/804,866

(22) Filed: May 21, 2007

(51) Int. Cl.
H03F 3/18 (2006.01)
(52) U.S. Cl. .................................. 330/264; 330/269
(58) Field of Classification Search .............. 330/264, 330/267, 269, 273
See application file for complete search history.

(56) References Cited

U.S. PATENT DOCUMENTS

| | | | | |
|---|---|---|---|---|
| 4,038,607 A | * | 7/1977 | Schade, Jr. | 330/264 |
| 5,754,078 A | * | 5/1998 | Tamagawa | 330/255 |
| 5,900,783 A | * | 5/1999 | Dasgupta | 330/264 |
| 6,657,495 B2 | | 12/2003 | Ivanov et al. | 330/255 |
| 6,696,895 B2 | * | 2/2004 | Tsukuda | 330/264 |
| 6,784,739 B2 | * | 8/2004 | Reffay et al. | 330/264 |
| 7,088,182 B2 | | 8/2006 | Ivanov | 330/265 |

* cited by examiner

Primary Examiner—Henry K Choe
(74) Attorney, Agent, or Firm—Tum Thach; Wade J. Brady, III; Frederick J. Telecky, Jr.

(57) ABSTRACT

A class AB output stage includes first ($M_P$) and a second ($M_N$) output transistors having sources coupled to first ($V_{DD}$) and second reference voltages, respectively, drains coupled to an output (13), and gates coupled to first (11A) and second (12A) conductors, respectively. Portions of first ($I_{IN1}$) and a second ($I_{IN2}$) input currents are sourced via a first input conductor (11) and a second input conductor (12), respectively, into and from sources of first (M2) and second (M4) transistors, respectively. Gates of the first (M2) and second (M4) transistors are coupled to the first and second conductors, respectively. First ($V_{refP}$) and second ($V_{refN}$) bias voltages are applied to gates of third (M1) and fourth (M3) transistors respectively, having sources coupled to the first and second input conductors, respectively, and drains coupled to the second conductor.

20 Claims, 5 Drawing Sheets

CLASS AB OUTPUT STAGE AND METHOD FOR PROVIDING WIDE SUPPLY VOLTAGE RANGE

BACKGROUND OF THE INVENTION

The present invention relates generally to operational amplifiers operable from low supply voltages, and especially to class AB output stages which are operable from supply voltages as low as 1 volt.

Various known circuits for CMOS amplifier output stages are operable from fairly low supply voltages, i.e., as low as roughly 2 volts, and also are operable over a relatively large supply voltage range. The relevant prior art is believed to include U.S. Pat. No. 6,657,495 "Operational Amplifier Output Stage and Method" issued Dec. 2, 2003 to Ivanov et al. and U.S. Pat. No. 7,088,182 "Class AB Output Stage Circuit with Stable Quiescent Current" issued Aug. 8, 2006 to Ivanov.

"Prior Art" FIG. 1 herein shows an operational amplifier 1 including a rail-to-rail differential input stage 2 which feeds into a folded cascode stage 3. Folded cascode stage 3 supplies a current $I_{IN1}$ through conductor 11 to one input of a class AB output stage 4. Folded cascode stage 3 also sinks a current $I_{IN2}$ through conductor 12 from the other input of class AB output stage 4. The currents $I_{IN1}$ and $I_{IN2}$ are dependent on the differential input voltage $Vin^+ - V_{in}^-$. Typically, the magnitude of the threshold voltage $V_{TP}$ of P-channel transistors is slightly greater than the magnitude of the threshold voltage $V_{TN}$ of N-channel transistors in a CMOS integrated circuit. Therefore, for a typical CMOS integrated circuit, the minimum supply voltage $V_{DD}$ at which operational amplifier 1 of FIG. 1 is operable is equal to the sum of the voltage drops across P-channel transistors 4F and 4G and the voltage drop across current source 4H, which at normal temperatures is in the range from roughly 2.2 volts to 2.5 volts, assuming the lower supply voltage $V_{SS}$ is at ground. Furthermore, it is believed that no other prior art class AB output stages are capable of operating at voltages less than approximately 1.5 volts.

There is increasing demand for low-cost, low-power CMOS operational amplifiers which are operable from supply voltages as low as approximately 1 volt and which also are operable over a supply voltage range of at least about 0.9 to 5.0 volts in order to allow power to be supplied by various common batteries. However, no satisfactory solutions to this need have been found in the available literature. All of the closest prior art very-low-voltage class AB output stages are characterized by poor linearity, limitation of the output current, poor stability of the class AB current, and/or unacceptable complexity. It would be highly desirable to have a class AB output stage for a CMOS amplifier operating at a supply voltage as low as 1.0 volts or less using current state-of-the-art CMOS manufacturing processes.

Thus, there is an unmet need for a CMOS class AB output stage that is operable at power supply voltages at least as low as approximately 0.9 to 1.0 volts.

There also is an unmet need for a CMOS class AB output stage that is operable at power supply voltages as low as approximately 0.9 to 1.0 volts and also is operable at a power supply voltage as high as approximately 5 volts.

There also is an unmet need for a CMOS class AB output stage that is operable at power supply voltages as low as approximately 0.9 to 1.0 volts and which is not characterized by poor linearity and/or limitations of the amount of output current and/or poor stability of the output current.

There also is an unmet need for a CMOS class AB output stage that is operable at power supply voltages as low as approximately 0.9 to 1.0 volts and which has a simple circuit configuration less complex than the closest prior art low voltage class AB output stages.

SUMMARY OF THE INVENTION

It is an object of the invention to provide a CMOS class AB output stage that is operable at power supply voltages at least as low as approximately 0.9 to 1.0 volts.

It is another object of the invention to provide a CMOS class AB output stage that is operable at power supply voltages as low as approximately 0.9 to 1.0 volts and also is operable at a power supply voltage as high as approximately 5 volts.

It is another object of the invention to provide a CMOS class AB output stage that is operable at power supply voltages as low as approximately 0.9 to 1.0 volts and which is not characterized by poor linearity and/or limitations of the amount of output current and/or poor stability of the output current.

It is another object of the invention to provide a CMOS class AB output stage that is operable at power supply voltages as low as approximately 0.9 to 1.0 volts and which has a circuit configuration less complex than the closest prior art low voltage class AB output stages.

Briefly described, and in accordance with one embodiment, the present invention provides a class AB output stage includes a first output transistor ($M_P$) having a source coupled to a first reference voltage ($V_{DD}$), a drain coupled to an output (13), and a gate coupled to a first conductor (11A), and a second output transistor ($M_N$) having a source coupled to a second reference voltage ($V_{SS}$), a drain coupled to the output conductor, and a gate coupled to a second conductor (12A). A portion of a first input current ($I_{IN1}$) flows into a first input conductor (11) and the source of a first transistor (M2) having a gate coupled to the first conductor and a portion of a second input current ($I_{IN2}$) flows out of the source of a second transistor (M4) having a gate coupled to the second conductor through a second input conductor (12). A first bias voltage ($V_{refP}$) is applied to a gate of a third transistor (M1) having a source coupled to the first input conductor and a drain coupled to the second conductor, and a second bias voltage ($V_{refN}$) is applied to a gate of a fourth transistor (M3) having a source coupled to the second input conductor and a drain coupled to the first conductor.

In one embodiment, the invention provides circuitry including a class AB output stage (4-1), the class AB output stage including a first output transistor ($M_P$) having a first electrode coupled to a first reference voltage ($V_{DD}$), a second electrode coupled to an output conductor (13), and a control electrode coupled to a first conductor (11A), and a second output transistor ($M_N$) having a first electrode coupled to a second reference voltage ($V_{SS}$), a second electrode coupled to the output conductor (13), and a control electrode coupled to a second conductor (12A). A first transistor (M2) has a first electrode coupled to a first input conductor (11) conducting a first input current ($I_{IN1}$), a second electrode coupled to the first conductor (11A), and a control electrode coupled to the first conductor (11A). A second transistor (M4) has a first electrode coupled to a second input conductor (12) conducting a second input current ($I_{IN2}$), a second electrode coupled to the second conductor (12A), and a control electrode coupled to the second conductor (12A). A third transistor (M1) has a first electrode coupled to the first input conductor (11), a second electrode coupled to the second conductor (12A), and a control electrode coupled to a first bias voltage conductor (17) to receive a first bias voltage ($V_{refP}$). A fourth transistor (M3)

has a first electrode coupled to the second input conductor (12), a second electrode coupled to the first conductor (11A), and a control electrode coupled to a second bias voltage conductor (18) to receive a second bias voltage ($V_{refN}$). A first bias circuit (15) produces the first bias voltage ($V_{refP}$) and a second bias circuit (16) produces the second bias voltage ($V_{refN}$). A folded cascode stage (3) coupled between the first ($V_{DD}$) and second ($V_{SS}$) reference voltages produces the first ($I_{IN1}$) and second ($I_{IN2}$) input currents in response to an input signal.

In a described embodiment, the first (M2) and third (M1) transistors have threshold voltages lower in magnitude than a threshold voltage of the first output transistor ($M_P$), and the second (M4) and fourth (M3) transistors have threshold voltages lower in magnitude than a threshold voltage of the second output transistor ($M_N$) in order to allow the folded cascode stage (3) to produce the first ($I_{IN1}$) and second ($I_{IN2}$) input currents.

In a described embodiment, the first output transistor ($M_P$) is a P-channel transistor, the second output transistor ($M_N$) is a N-channel transistor, the first electrodes are drains, the second electrodes are sources, and the control electrodes are gates. The first (M2) and third (M1) transistors are P-channel transistors and the second (M4) and fourth (M3) transistors are N-channel transistors. The first bias circuit (15) includes a P-channel fifth transistor ($M_{Pref}$) having a source coupled to the first reference voltage ($V_{DD}$) and a gate and drain coupled to a first current source ($I_P$) by the first reference voltage conductor (17) to produce the first bias voltage ($V_{refP}$) thereon. The second bias circuit (15) includes a N-channel sixth transistor ($M_{Nref}$) having a source coupled to the second reference voltage ($V_{SS}$) and a gate and drain coupled to a second current source ($I_N$) by the second reference voltage conductor (18) to produce the second bias voltage ($V_{refN}$) thereon.

In a described embodiment, the first current source ($I_P$) is scaled with respect to a channel width of the first output transistor ($M_P$) so as to match a desired value of a quiescent current in the first output transistor ($M_P$), and current produced by the second current source ($I_N$) is scaled with respect to a channel width of the second output transistor ($M_N$) so as to match a desired value of a quiescent current in the second output transistor ($M_N$). The first bias voltage ($V_{refP}$) corresponds to a gate voltage of the first output transistor ($M_P$), and the second bias voltage ($V_{refN}$) corresponds to a gate voltage of the second output transistor ($M_N$).

In a described embodiment, the first (15) and second (16) bias circuits adjust the first ($V_{refP}$) and second ($V_{refN}$) bias voltages in response to changes in an output voltage (Vout) produced on the output conductor (13) to stabilize quiescent current in the output transistors.

In a described embodiment, the class AB output stage includes a fifth transistor (M2B) having a first electrode coupled to the first input conductor (11), a second electrode coupled to the second conductor (12A), and a control electrode coupled to the first conductor (11A), and also includes a sixth transistor (M4B) having a first electrode coupled to the second input conductor (12), a second electrode coupled to the first conductor (11A), and a control electrode coupled to the second conductor (12A). A channel width of the first transistor (M2A) is approximately 10 times a channel width of the fifth transistor (M2B) and a channel width of the second transistor (M4A) is approximately 10 times a channel width of the sixth transistor (M4B). The fifth transistor (M2B) has a threshold voltage lower in magnitude than the threshold voltage of the first output transistor ($M_P$), and the sixth transistor (M4B) has a threshold voltage lower in magnitude than the threshold voltage of the second output transistor ($M_N$). The first output transistor ($M_P$) and the fifth transistor (M2B) are P-channel transistors, the second output transistor ($M_N$) and the sixth transistor (M4B) are N-channel transistors, the first electrodes are drains, the second electrodes are sources, and the control electrodes are gates. The first (M2A), third (M1), and fifth (M2B) are PNP transistors the first electrodes of which are emitters, of the second electrodes of which are collectors, and the control electrodes of which are bases.

In one embodiment, first body electrode biasing circuitry (D1,I1) is coupled to body electrodes of the first (M2A) and third (M1) transistors to reduce threshold voltages thereof, and second body electrode biasing circuitry (D2,I2) is coupled to body electrodes of the second (M4A) and fourth (M3) transistors to reduce threshold voltages thereof. In one embodiment, the class AB output stage (4-3) includes a P-channel fifth transistor (M2B) having a first source coupled to the first input conductor (11), a drain coupled to the second conductor (12A), and a gate coupled to the first conductor (11A), and also includes a N-channel sixth transistor (M4B) having a source coupled to the second input conductor (12), a drain coupled to the first conductor (11A), and a gate coupled to the second conductor (12A). A body electrode of the fifth transistor (M2B) is coupled to the first body electrode biasing circuitry (D1,I1), and a body electrode of the sixth transistor (M4B) is coupled to the second body electrode biasing circuitry (D2,I2).

In one embodiment, the invention provides a method of operating a class AB output stage (4-1) at a low supply voltage ($V_{DD}$–$V_{SS}$), including providing a first output transistor ($M_P$) having a first electrode coupled to a first reference voltage ($V_{DD}$), a second electrode coupled to an output conductor (13), and a control electrode coupled to a first conductor (11A), and a second output transistor ($M_N$) having a first electrode coupled to a second reference voltage ($V_{SS}$), a second electrode coupled to the output conductor (13), and a control electrode coupled to a second conductor (12A), sourcing at least a portion of a first input current ($I_{IN1}$) flowing in a first input conductor (11) through first and second electrodes of a first transistor (M2) having a control electrode coupled to the first conductor (11A) and sinking at least a portion of a second input current ($I_{IN2}$) flowing in a second input conductor (12) through first and second electrodes of a second transistor (M4) having a control electrode coupled to the second conductor (12A), and applying a first bias voltage ($V_{refP}$) to a control electrode of a third transistor (M1) having a first electrode coupled to the first input conductor (11) and a second electrode coupled to the second conductor (12A), and applying a second bias voltage ($V_{refN}$) to a control electrode of a fourth transistor (M3) having a first electrode coupled to the second input conductor (12) and a second electrode coupled to the first conductor (11A). In a described embodiment, the method includes scaling current produced by the first current source ($I_P$) with respect to a channel width of the first output transistor ($M_P$) so as to match a desired value of a quiescent current in the first output transistor ($M_P$), and scaling current produced by the second current source ($I_N$) with respect to a channel width of the second output transistor ($M_N$) so as to match a desired value of a quiescent current in the second output transistor ($M_N$). The first bias voltage ($V_{refP}$) is produced so that it corresponds to a gate voltage of the first output transistor ($M_P$), and the second bias voltage ($V_{refN}$) is produced so that it corresponds to a gate voltage of the second output transistor ($M_N$).

In one embodiment, the invention provides a low voltage class AB output stage including a first output transistor ($M_P$) having a first electrode coupled to a first reference voltage ($V_{DD}$), a second electrode coupled to an output conductor (13), and a control electrode coupled to a first conductor (11A), and a second output transistor ($M_N$) having a first electrode coupled to a second reference voltage ($V_{SS}$), a second electrode coupled to the output conductor (13), and a control electrode coupled to a second conductor (12A), means for sourcing at least a portion of a first input current ($I_{IN1}$) flowing in a first input conductor (11) through first and second electrodes of a first transistor (M2) having a control electrode coupled to the first conductor (11A) and for sinking at least a portion of a second input current ($I_{IN2}$) flowing in a second input conductor (12) through first and second electrodes of a second transistor (M4) having a control electrode coupled to the second conductor (12A), and means for applying a first bias voltage ($V_{refP}$) to a control electrode of a third transistor (M1) having a first electrode coupled to the first input conductor (11) and a second electrode coupled to the second conductor (12A), and applying a second bias voltage ($V_{refN}$) to a control electrode of a fourth transistor (M3) having a first electrode coupled to the second input conductor (12) and a second electrode coupled to the first conductor (11A).

DETAILED DESCRIPTION OF THE PREFERRED EMBODIMENTS

Figure 2:
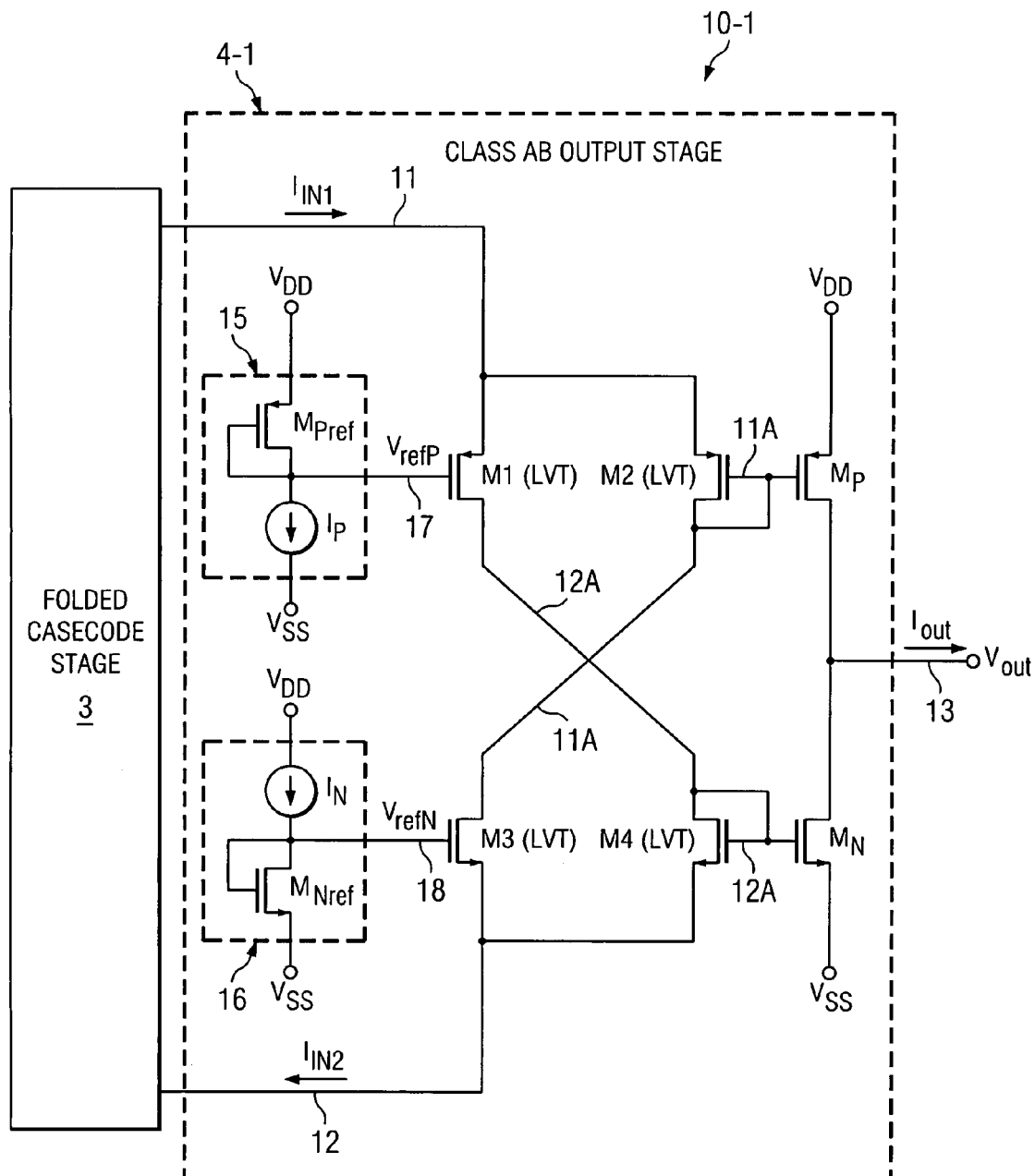
FIG. 2 is a schematic diagram of a basic implementation of the present invention.

FIG. 2, which illustrates a basic implementation of the present invention, shows amplifier circuitry 10-1 including the above described prior art folded cascode circuit 3 coupled to a class AB output stage 4-1 according to the present invention. Output stage 4-1 includes P-channel output transistor $M_P$ having its source connected to $V_{DD}$ and its gate connected to conductor 11A and its drain connected to conductor 13, which conducts output voltage Vout. Conductor 13 also is connected to the drain of N-channel output transistor $M_N$. The source of output transistor $M_N$ is connected to $V_{SS}$, which may be at ground. The gate of output transistor $M_N$ is connected to conductor 12A. An output current Iout flows through conductor 13. Output transistors $M_P$ and $M_N$ both have "standard" threshold voltages.

Figure 1:
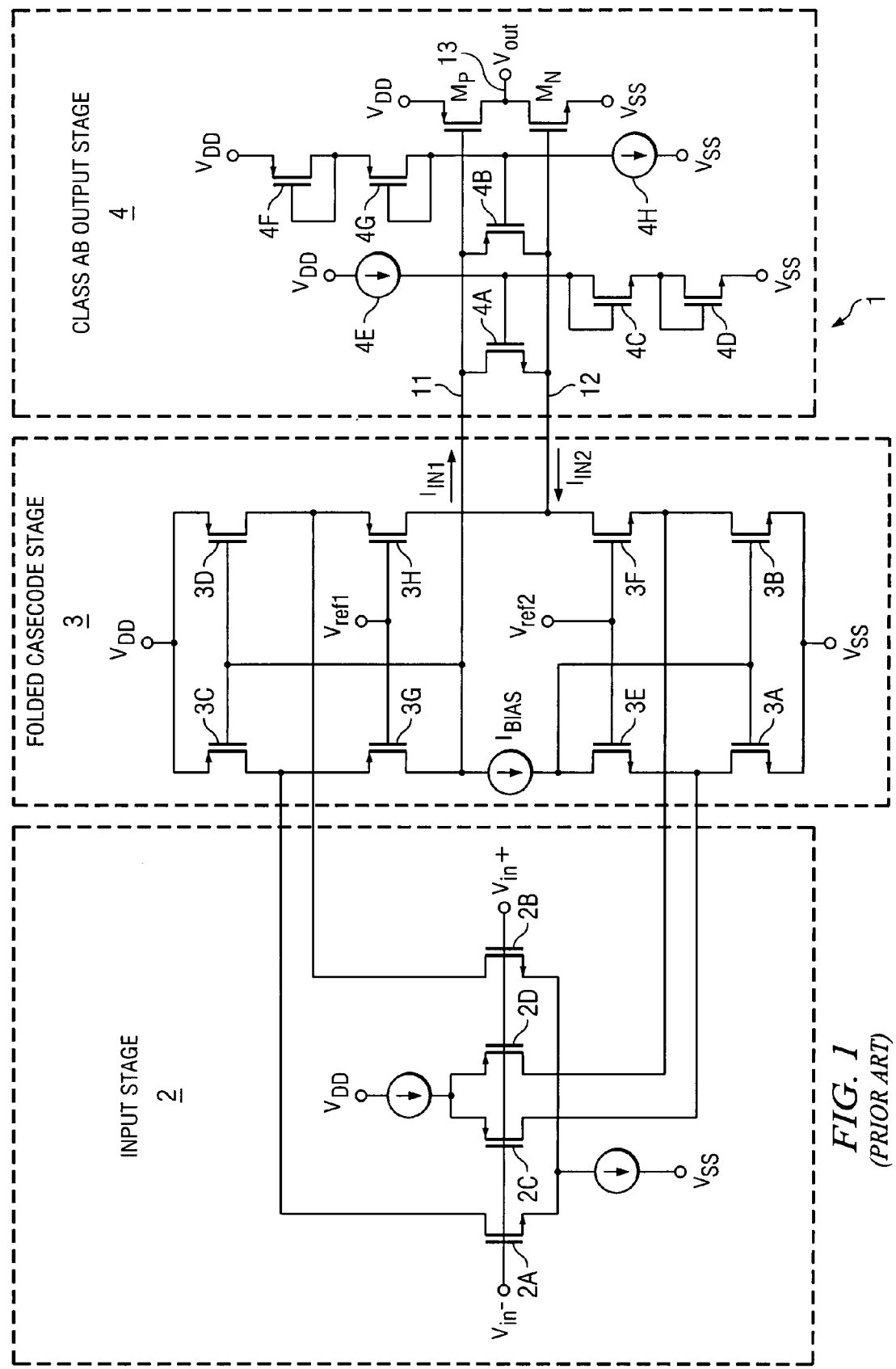
FIG. 1 is a schematic diagram of a prior art operational amplifier including a class AB output stage

Conductor 11A is connected to the gate and drain of a "low" threshold voltage (LVT) P-channel transistor M2 which has its source connected by conductor 11 to one output of folded cascode circuit 3, details of which are shown in FIG. 1. Similarly, conductor 12A is connected to the gate and drain of a low threshold voltage (indicated by "LVT" in the drawings)—channel transistor M4 which has its source connected by conductor 12 to the other output of folded cascode circuit 3. Conductor 11 also is connected to the source of low threshold voltage P-channel transistor M1, the drain of which is connected by conductor 12A to the gate and drain of low threshold voltage transistor M4 and the gate of output transistor $M_N$. Conductor 12 also is connected to the source of low threshold voltage-channel transistor M3, the drain of which is connected by conductor 11A to the gate and drain of low threshold voltage transistor M2 and the gate of output transistor $M_P$.

The gate of low threshold voltage transistor M1 is connected by conductor 17 to a bias circuit 15 which includes P-channel transistor $M_{Pref}$ and current source $I_P$. Transistor $M_{Pref}$ has its source connected to $V_{DD}$ and its gate and drain connected by conductor 17 to a first terminal of current source $I_P$, the other terminal of which is connected to $V_{SS}$. A bias voltage $V_{refP}$ is provided on conductor 17. Similarly, the gate of low threshold voltage transistor M3 is connected by conductor 18 to a reference circuit 16 which includes N-channel transistor $M_{Nref}$ and current source $I_N$. Transistor $M_{Nref}$ has its source connected to $V_{SS}$ and its gate and drain connected by conductor 18 to a first terminal of current source $I_N$, the other terminal of which is connected to $V_{DD}$. A bias $V_{refN}$ is produced on conductor 18.

The bias voltages $V_{refP}$ and $V_{refN}$ generated by bias voltage circuits 15 and 16 at the gates of transistors $M_1$ and $M_3$, respectively, must appropriately correspond to or "match" (but not ordinarily be equal to) the gate voltages of output transistors $M_P$ and $M_N$, respectively, when they are operating at their lowest current levels, i.e., at their quiescent current levels. (The drain to source voltages of transistor $M_{Pref}$ and output transistor $M_P$ are not matched.) The current sources $I_P$ and $I_N$ match the minimum (quiescent) current values in output transistors $M_P$ and $M_N$, respectively, in the sense that transistor geometries of the current sources are appropriately scaled with respect to geometries of output transistors $M_P$ and $M_N$, so as to match the desired value of the quiescent currents in output transistors $M_P$ and $M_N$. The minimum current value $I_P$ flows through transistor $M_{Pref}$ and the minimum current value $I_N$ flows through transistor $M_{Nref}$, and similarly, the gate to source voltage $V_{GS}$ of transistor $M_{Pref}$ matches the $V_{GS}$ of transistor $M_P$, and the gate to source voltage $V_{GS}$ of $M_{Nref}$ matches $V_{GS}$ of transistor $M_N$ when they are both conducting the minimum (quiescent) current at the same time.

Output voltage Vout and output current Iout are controlled in response to the input currents $I_{IN1}$ and $I_{IN2}$ produced by folded cascode circuit 3. The shoot-through current of class AB output stage 4-1 is determined by the reference voltages VrefP and VrefN, which can be generated by conventional reference voltage circuits as shown or by more complex reference voltage circuitry which tracks and adjusts VrefP and VrefN in response to changes in $V_{DD}$ and/or Vout in order to make the quiescent current in the output transistors more stable with respect to power supply voltages and/or output voltage variations.

In order to have adequate voltage "head room" to allow $I_{IN1}$ to be sourced by P-channel transistors 3C and 3G (FIG. 1) of folded cascode stage 3 and also to allow N-channel transistors 3F and 3B of folded cascode stage 3 to "sink" $I_{IN2}$, it is necessary that the threshold voltages $V_{TP}$ and $V_{TN}$ of P-channel transistor M2 and N-channel transistor M4, respectively, be smaller than the threshold voltages of the corresponding output transistors $M_P$ and $M_N$, respectively. In some CMOS manufacturing processes, both low threshold voltage (indicated on the drawings by "LVT") P-channel transistors and low threshold voltage N-channel transistors are available. However, in some other CMOS manufacturing processes low threshold voltage transistors are not available, but other options in accordance with the present invention are available as in subsequently described FIGS. 4 and 5.

Transistor $M_P$ usually has a larger threshold voltage than output transistor $M_N$ by, for example, about 200 millivolts, and the gate of transistor $M_P$ will be at nearly the same voltage as conductor 12 through which folded cascode output current $I_{IN2}$ flows. If the $V_{GS}$ voltage of output transistor $M_P$ needs to increase but the voltage at the gate thereof is below the voltage of conductor 12 during normal operation, class AB stage 4-1 becomes non-operational.

The minimum value of $V_{DD}$ at which class AB output stage 4-1 of FIG. 2 is operable, assuming $V_{SS}$ is at ground, is given by the expression $$V_{DD}(\min)=V_{GSP}+(V_{GSN}-V_{GSN}(LVT)),$$

which can be as low as 0.9 volts at normal integrated circuit operating temperature. The voltage on the source of transistor $M_4$ is equal to $V_{GSN}-V_{GSN}(LVT)$, and the source-drain voltage of transistor $M_3$ is equal to zero. The voltage on conductor 12 through which $I_{IN2}$ flows is equal to the difference between the threshold voltages $V_{GSN}-V_{GSN}(LVT)$ of $M_N$ and $M_4$. Similarly, the voltage on conductor 11 through which $I_{IN1}$ flows is equal to the difference between the threshold voltages $V_{GSP}-V_{GSP}(LVT)$ of $M_P$ and $M_2$.

A complete shutdown of one of output transistors $M_P$ and $M_N$ in FIG. 2 can occur when the other output transistor conducts a large current. For example, assuming a very large input current $I_{IN2}$ (which flows through N-channel transistors 3F and 3B of folded cascode stage 3) and also assuming a small current $I_{IN1}$, the large value of $I_{IN2}$ pulls the gate and drain of transistor $M_2$ down to a low voltage level. All of current $I_{IN1}$ flows through transistors $M_2$ and $M_3$ and the transistors 3F and 3B of folded cascode circuit 3. This means that the gate of transistor $M_4$, and hence the gate of transistor $M_N$, are very low and therefore transistor $M_N$ is completely turned off. There is no current through transistor $M_1$ because under these conditions all of the current $I_{IN1}$ flows through transistor $M_2$. Consequently, there is no current available to flow through transistor $M_4$ to generate a gate voltage on conductor 12A to keep output transistor $M_N$ at least slightly turned on.

Figure 3:
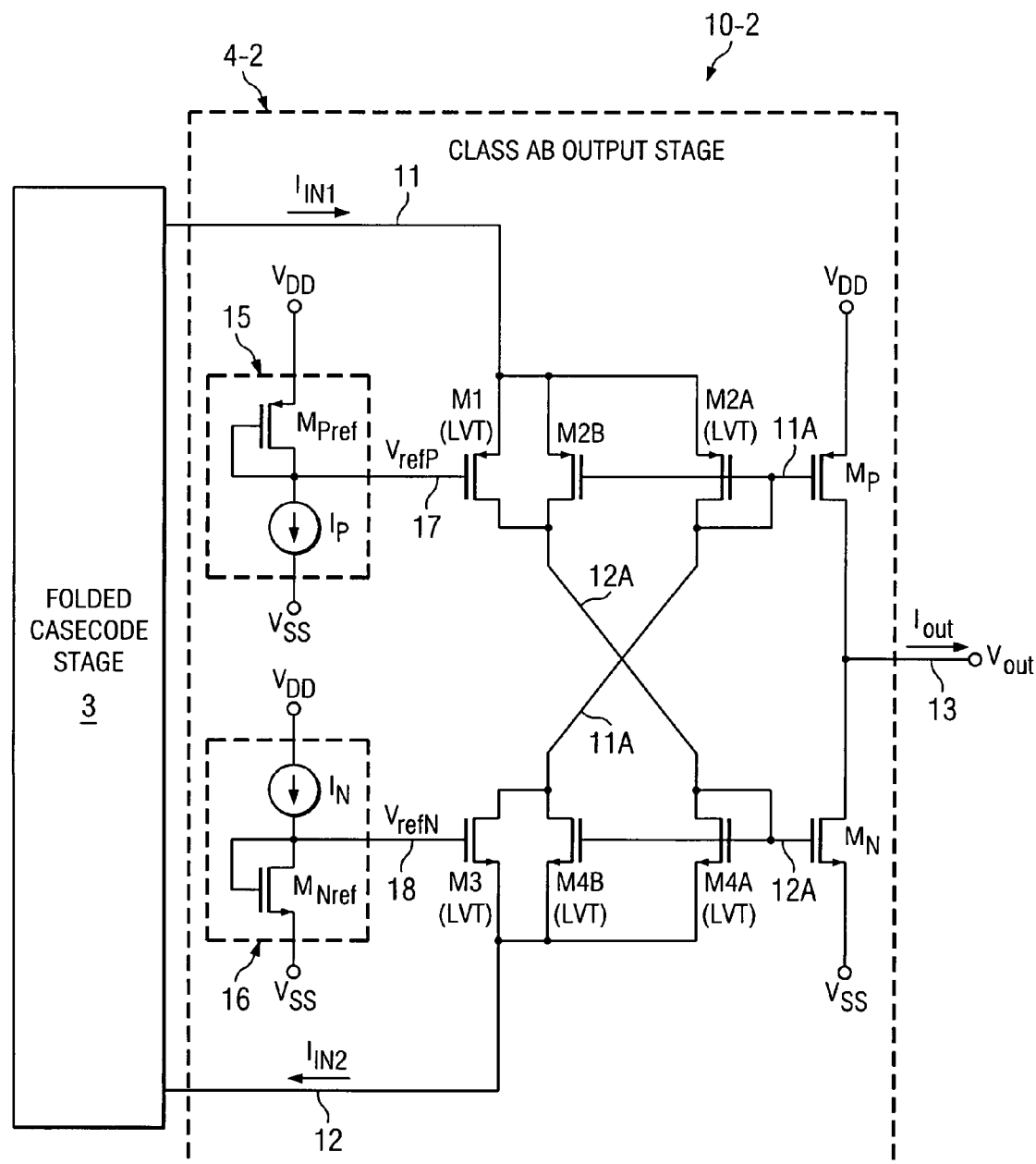
FIG. 3 is a schematic diagram of another implementation of the present invention.

Referring next to FIG. 3, class AB output stage 4-2 of amplifier circuitry 10-1 is similar to that in class AB output stage 4-1 of FIG. 2, except that P-channel transistor M2 of FIG. 2 has in effect been "split" into two low threshold voltage transistors including transistor M2A and transistor M2B in FIG. 3. Both of transistors M2A and M2B have their gates connected to conductor 11A and their sources connected to conductor 11. The W/L (channel-width-to-channel-length) ratio of transistor M2A is much larger, e.g. 10 times larger, than that of transistor M2B. The drain of transistor M2A is connected to conductor 11A. The drain of transistor M2B is connected to conductor 12A. Similarly, N-channel transistor M4 of FIG. 2 has been "split" into two low threshold voltage transistors, including transistor M4A and transistor M4B in FIG. 3, both of which have their gates connected to conductor 12A and their sources connected to conductor 12. The W/L (channel-width-to-channel-length) ratio of transistor M4A is much larger, e.g. 10 times larger, then that of transistor M4B. The drain of transistor M4A also is connected to conductor 12A. The drain of transistor M4B is connected to conductor 11A. Transistors $M_1$, $M_2$, M2A, M2B, M4A, and M4B are low threshold voltage transistors, as indicated by "LTV" in the drawings.

In class AB output stage 4-2 of FIG. 3, under the condition that $I_{IN2}$ is very large, the input current $I_{IN1}$ is split between transistors $M_{2A}$ and $M_{2B}$, so there is a small amount of $I_{IN1}$ flowing through transistor $M_{2A}$ to the gate of transistor $M_N$ and the folded cascode circuit 3. That portion of $I_{IN1}$ produces a voltage on conductor 12A which keeps keep transistor $M_N$ turned slightly on. Analogous operation occurs to keep output transistor $M_P$ turned slightly on if $I_{IN1}$ is very large and $I_{IN2}$ is very small.

The currents $I_{IN1}$ and $I_{IN2}$ which determine the output voltage Vout in turn are determined by the differential input voltage (Vin$^+$–Vin$^-$) applied to the input stage 2 of amplifier 1 in FIG. 1. Vout typically also is determined by a main external feedback loop (not shown) of the operational amplifier. In class AB stage 4-2 of FIG. 3, the smallest of the two currents of the output transistors is determined in response to "local feedback" through the path including transistor $M_{2A}$ for output transistor $M_P$ and through the path including transistor $M_{4A}$ for output transistor $M_N$. This local feedback results in the benefit of keeping the quiescent current of the stages stable without affecting the output voltage Vout and output current Iout defined by the operational amplifier input voltage.

Figure 4:
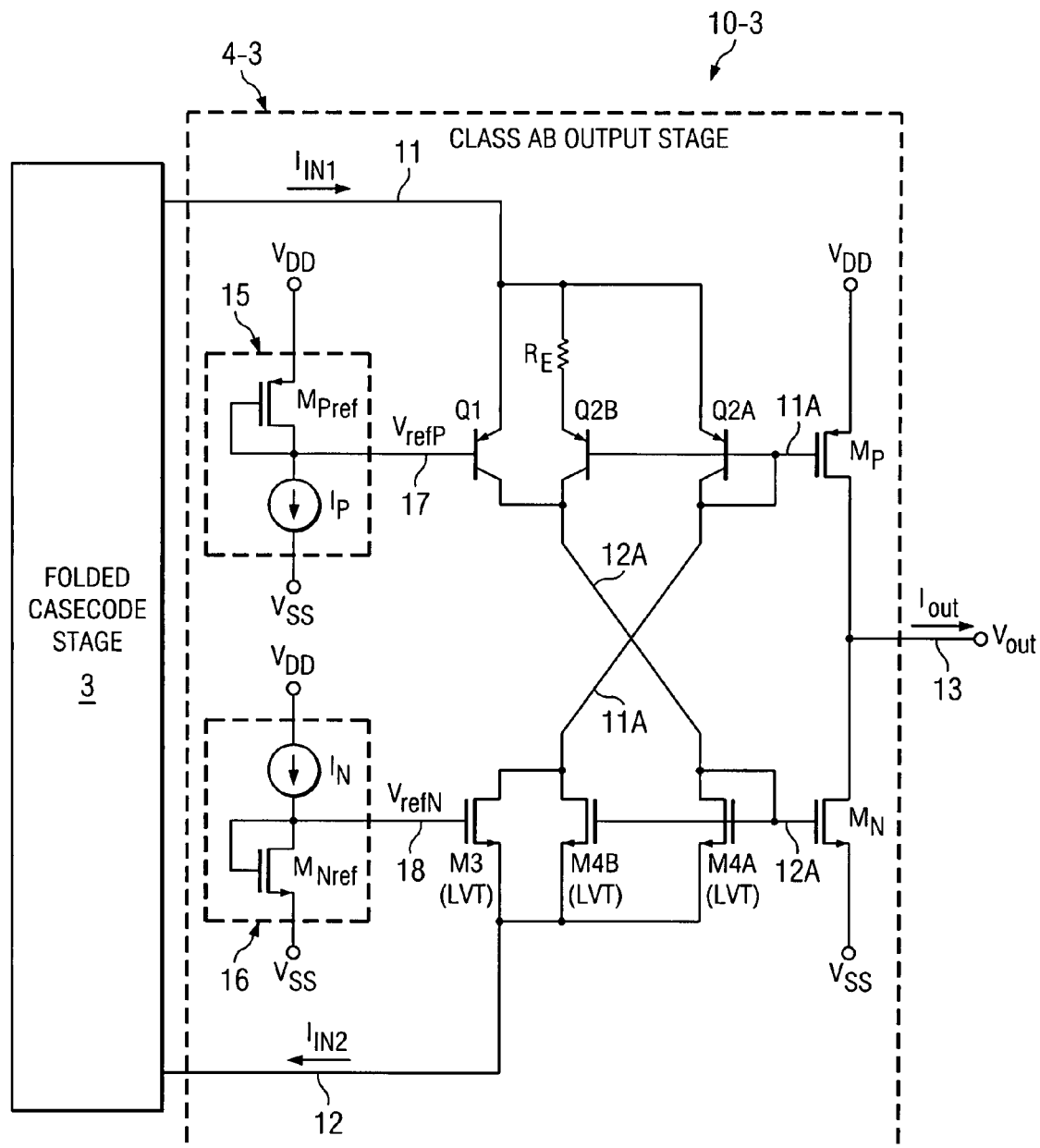
FIG. 4 is a schematic diagram of another embodiment of the present invention.

FIG. 4 shows a class AB output stage 4-3 which is useful in the case wherein the CMOS manufacturing process can not provide a low threshold voltage P-channel transistor but can provide a PNP transistor having a $V_{BE}$ voltage (base-emitter voltage) which is less than the P-channel transistor threshold voltage $V_{TP}$. Class AB output stage 4-3 of FIG. 4 is essentially the same as output stage 4-2 of FIG. 3, except that Class AB output stage 4-3 of FIG. 4 includes PNP transistors Q2A and Q2B in place of P-channel transistors M2A and M2B, respectively, of FIG. 3. The bases of PNP transistors Q2A and Q2B are connected to conductor 11A. The emitter of transistor Q2A is connected directly to conductor 11, and the emitter of transistor Q2B is coupled by a degeneration resistor RE to conductor 11. The collector of transistor Q2A is connected to conductor 11A, and a drain of transistor Q2B is connected to conductor 12A. The difference in the approximately 0.6 volt $V_{BE}$ voltage of PNP transistors Q2A and Q2B and the approximately 0.9 volt $V_{TP}$ threshold voltage of output transistor $M_P$ provides the voltage headroom needed for transistors 3C and 3G of folded cascode circuit 3 to generate the current $I_{IN1}$. The operation of the class AB output stage 4-3 of FIG. 4 is essentially the same as the class AB output stage 4-2 of FIG. 3.

Figure 5:
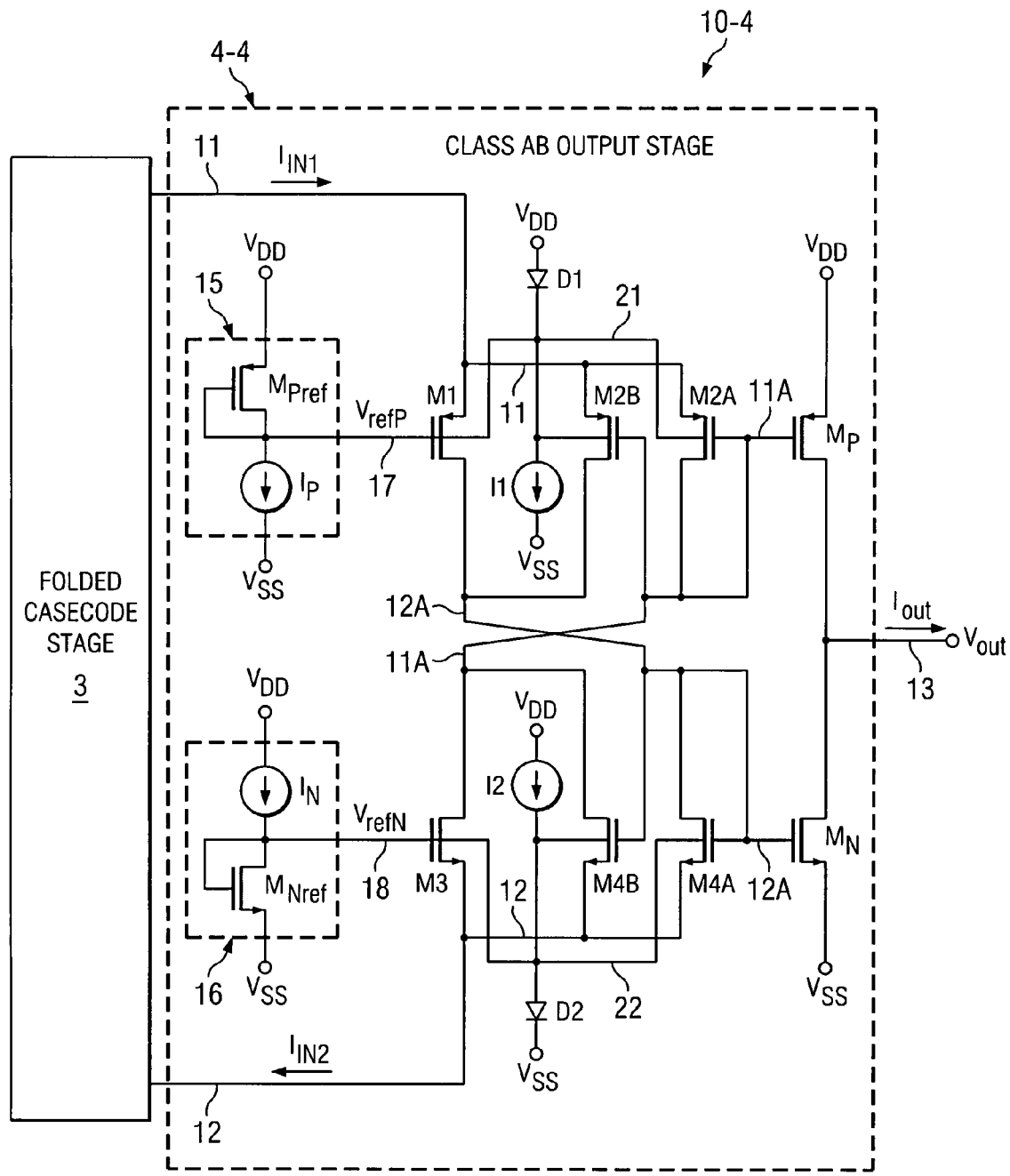
FIG. 5 is a schematic diagram of yet another embodiment of the present invention.

FIG. 5 shows a class AB output stage 4-4 that is useful in the case wherein the CMOS manufacturing process can not provide low threshold voltage P-channel or N-channel transistors or bipolar transistors having lower $V_{BE}$ voltages which are lower in the magnitude than the corresponding CMOS transistor threshold voltages. Referring to FIG. 5, P-channel transistors M1, M2B, and M2A and the N-channel transistors M3, M4B, and M4A are connected as in FIG. 3, but the body electrodes of P-channel transistors M1, M2B, and M2A are connected by conductor 21 to the anode of a diode D1 having its anode connected to $V_{DD}$ through which a bias current $I_1$ flows. (Alternatively, the bias voltage produced on conductor 21 could instead be produced by some other suitable reference voltage circuit.) Similarly, the body electrodes of N-channel transistors M3, M4B, and M4A are connected by conductor 22 to the anode of a diode D2 (or other suitable reference voltage circuit) having its anode connected to $V_{SS}$ through which a bias current $I_2$ flows. This provides a forward voltage bias of the PN junctions between the body regions and source regions of the MOS transistors and decreases their threshold voltages, thereby allowing class AB output stage 4-4 of FIG. 5 to operate essentially the same as output stage 4-3 of FIG. 3.

In contrast to prior art, the present invention provides a class AB output stage having simple, efficient, highly linear class AB current control operation from a low supply voltage less than approximately 1 volt. Furthermore, present invention provides local feedback loops around output devices of a class AB output stage for controlling minimum currents in output transistors $M_P$ and $M_N$.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the invention could be useful in an integrated circuit in which output transistors $M_P$ and $M_N$ are bipolar transistors if their $V_{BE}$ (base-emitter) voltages are greater than the threshold voltages of the corresponding low threshold voltage transistors.

What is claimed is:

1. Circuitry including a class AB output stage, the class AB output stage comprising:
   (a) a first output transistor having a first electrode coupled to a first reference voltage, a second electrode coupled to an output conductor, and a control electrode coupled to a first conductor, and a second output transistor having a first electrode coupled to a second reference voltage, a second electrode coupled to the output conductor, and a control electrode coupled to a second conductor;
   (b) a first transistor having a first electrode coupled to a first input conductor conducting a first input current, a second electrode coupled to the first conductor, and a control electrode coupled to the first conductor, and a second transistor having a first electrode coupled to a second input conductor conducting a second input current, a second electrode coupled to the second conductor, and a control electrode coupled to the second conductor;
   (c) a third transistor having a first electrode coupled to the first input conductor, a second electrode coupled to the second conductor, and a control electrode coupled to a first bias voltage conductor to receive a first bias voltage, and a fourth transistor having a first electrode coupled to the second input conductor, a second electrode coupled to the first conductor, and a control electrode coupled to a second bias voltage conductor to receive a second bias voltage;
   (d) a first bias circuit for producing the first bias voltage and a second bias circuit for producing the second bias voltage; and
   (e) a folded cascode stage coupled between the first and second reference voltages for producing the first and second input currents in response to an input signal.

2. The circuitry of claim 1 wherein the first and third transistors have threshold voltages lower in magnitude than a threshold voltage of the first output transistor, and wherein the second and fourth transistors have threshold voltages lower in magnitude than a threshold voltage of the second output transistor in order to allow the folded cascode stage to produce the first and second input currents.

3. The circuitry of claim 2 wherein the first output transistor is a P-channel transistor, the second output transistor is a N-channel transistor, the first electrodes are drains, the second electrodes are sources, and the control electrodes are gates.

4. The circuitry of claim 3 wherein the first and third transistors are P-channel transistors and the second and fourth transistors are N-channel transistors.

5. The circuitry of claim 4 wherein the first bias circuit includes a P-channel fifth transistor having a source coupled to the first reference voltage and a gate and drain coupled to a first current source by the first reference voltage conductor to produce the first bias voltage thereon, and wherein the second bias circuit includes a N-channel sixth transistor having a source coupled to the second reference voltage and a gate and drain coupled to a second current source by the second reference voltage conductor to produce the second bias voltage thereon.

6. The circuitry of claim 5 wherein current produced by the first current source is scaled with respect to a channel width of the first output transistor so as to match a desired value of a quiescent current in the first output transistor, and wherein current produced by the second current source is scaled with respect to a channel width of the second output transistor so as to match a desired value of a quiescent current in the second output transistor.

7. The circuitry of claim 5 wherein the first bias voltage corresponds to a gate voltage of the first output transistor, and wherein the second bias voltage corresponds to a gate voltage of the second output transistor.

8. The circuitry of claim 2 wherein the first and second bias circuits adjust the first and second bias voltages in response to changes in an output voltage produced on the output conductor.

9. The circuitry of claim 4 wherein the class AB output stage includes a fifth transistor having a first electrode coupled to the first input conductor, a second electrode coupled to the second conductor, and a control electrode coupled to the first conductor, and also includes a sixth transistor having a first electrode coupled to the second input conductor, a second electrode coupled to the first conductor, and a control electrode coupled to the second conductor.

10. The circuitry of claim 9 wherein a channel width of the first transistor is approximately 10 times a channel width of the fifth transistor and a channel width of the second transistor is approximately 10 times a channel width of the sixth transistor.

11. The circuitry of claim 9 wherein the fifth transistor has a threshold voltage lower in magnitude than the threshold voltage of the first output transistor, and wherein the sixth transistor has a threshold voltage lower in magnitude than the threshold voltage of the second output transistor.

12. The circuitry of claim 11 wherein the first output transistor and the fifth transistor are P-channel transistors, the second output transistor and the sixth transistor are N-channel transistors, the first electrodes are drains, the second electrodes are sources, and the control electrodes are gates.

13. The circuitry of claim 9 wherein the first, third, and fifth are PNP transistors the first electrodes of which are emitters, of the second electrodes of which are collectors, and the control electrodes of which are bases.

14. The circuitry of claim 4 including first body electrode biasing circuitry coupled to body electrodes of the first and third transistors to reduce threshold voltages thereof, and second body electrode biasing circuitry coupled to body electrodes of the second and fourth transistors to reduce threshold voltages thereof.

15. The circuitry of claim 14 wherein the class AB output stage includes a P-channel fifth transistor having a first source coupled to the first input conductor, a drain coupled to the second conductor, and a gate coupled to the first conductor, and also includes a N-channel sixth transistor having a source coupled to the second input conductor, a drain coupled to the first conductor, and a gate coupled to the second conductor, a body electrode of the fifth transistor being coupled to the first body electrode biasing circuitry, a body electrode of the sixth transistor being coupled to the second body electrode biasing circuitry.

16. The circuitry of claim 1 wherein the folded cascode stage is driven by a differential input stage receiving a differential input signal.

17. A method of operating a class AB output stage at a low supply voltage, comprising:
   (a) providing a first output transistor having a first electrode coupled to a first reference voltage, a second electrode coupled to an output conductor, and a control electrode coupled to a first conductor, and a second output transistor having a first electrode coupled to a second reference voltage, a second electrode coupled to the output conductor, and a control electrode coupled to a second conductor;
   (b) sourcing at least a portion of a first input current flowing in a first input conductor through first and second electrodes of a first transistor having a control electrode coupled to the first conductor and sinking at least a portion of a second input current flowing in a second input conductor through first and second electrodes of a second transistor having a control electrode coupled to the second conductor; and
   (c) applying a first bias voltage to a control electrode of a third transistor having a first electrode coupled to the first input conductor and a second electrode coupled to the second conductor, and applying a second bias voltage to a control electrode of a fourth transistor having a first electrode coupled to the second input conductor and a second electrode coupled to the first conductor.

18. The method of claim 17 including scaling current produced by the first current source with respect to a channel width of the first output transistor so as to match a desired value of a quiescent current in the first output transistor, and scaling current produced by the second current source with respect to a channel width of the second output transistor so as to match a desired value of a quiescent current in the second output transistor.

19. The method of claim 17 including producing the first bias voltage so that it corresponds to a gate voltage of the first output transistor, and producing the second bias voltage so that it corresponds to a gate voltage of the second output transistor.

20. A class AB output stage operable at a low supply voltage, comprising:
   (a) a first output transistor having a first electrode coupled to a first reference voltage, a second electrode coupled to an output conductor, and a control electrode coupled to a first conductor, and a second output transistor having a first electrode coupled to a second reference voltage, a second electrode coupled to the output conductor, and a control electrode coupled to a second conductor;
   (b) means for sourcing at least a portion of a first input current flowing in a first input conductor through first and second electrodes of a first transistor having a control electrode coupled to the first conductor and for sinking at least a portion of a second input current flowing in a second input conductor through first and second electrodes of a second transistor having a control electrode coupled to the second conductor; and
   (c) means for applying a first bias voltage to a control electrode of a third transistor having a first electrode coupled to the first input conductor and a second electrode coupled to the second conductor, and applying a second bias voltage to a control electrode of a fourth transistor having a first electrode coupled to the second input conductor and a second electrode coupled to the first conductor.

* * * * *